United States Patent
Mendoza et al.

(10) Patent No.: US 10,663,530 B2
(45) Date of Patent: May 26, 2020

(54) TEST SWITCH ASSEMBLY HAVING AN ELECTRONIC CIRCUIT

(71) Applicant: ABB Schweiz AG, Baden (CH)

(72) Inventors: Malbin Jose Mendoza, Weston, FL (US); Prerak N. Shah, Coral Springs, FL (US); Todd Alan Gentile, Tamarac, FL (US); Douglas A. Voda, Sanford, FL (US); Harshavardhan M. Karandikar, Longwood, FL (US); Richard Lindo, Lauderhill, FL (US); Dennis F. Batovsky, Langhorne, PA (US)

(73) Assignee: ABB Schweiz AG, Baden (CH)

( * ) Notice: Subject to any disclaimer, the term of this patent is extended or adjusted under 35 U.S.C. 154(b) by 540 days.

(21) Appl. No.: 15/453,523

(22) Filed: Mar. 8, 2017

(65) Prior Publication Data

US 2018/0259588 A1    Sep. 13, 2018

(51) Int. Cl.
  *G01R 31/40* (2020.01)
  *H02B 1/04* (2006.01)
  *H02B 1/24* (2006.01)

(52) U.S. Cl.
  CPC .......... *G01R 31/40* (2013.01); *H02B 1/04* (2013.01); *H02B 1/24* (2013.01)

(58) Field of Classification Search
  CPC .. G01E 31/40; H02B 1/24; H02B 1/04; G01R 31/40
  USPC .......................................................... 361/88
  See application file for complete search history.

(56) References Cited

U.S. PATENT DOCUMENTS

| 9,263,217 | B2 | 2/2016 | Ball |
| 2008/0180195 | A1* | 7/2008 | Nakano .............. H01H 71/0207 335/7 |
| 2011/0028031 | A1 | 2/2011 | Bower et al. |
| 2013/0120090 | A1* | 5/2013 | Ball ...................... H01H 83/04 335/1 |
| 2015/0339908 | A1 | 11/2015 | Masters et al. |

FOREIGN PATENT DOCUMENTS

| CN | 104467182 A | 3/2015 |
| WO | 2011106261 A1 | 9/2011 |
| WO | 2014105769 A1 | 7/2014 |

OTHER PUBLICATIONS

International Searching Authority, International Search Report and Written Opinion issued in international application No. PCT/US2018/041785, dated Sep. 24, 2018, 8 pp.

* cited by examiner

*Primary Examiner* — Dharti H Patel
(74) *Attorney, Agent, or Firm* — Taft Stettiniut & Hollister LLP; J. Bruce Schelkopf

(57) ABSTRACT

A test switch assembly electrically coupled with an electronic module. The electronic module is designed with intelligent sophisticated circuitry that facilitates the transmission and/or the detection of currents and/or voltages between a protective relay and current or voltage transformers. In one embodiment, the electronic test switch senses, detects, monitors, analyzes and/or stores electrical signals and outputs this information to standalone displays, computers, RTU, or similar devices, through wired or wireless connections. The electronic module also allows the test switch to accept electrical connectors such as RJ45, USB, RCA, and/or BNC, among others.

22 Claims, 12 Drawing Sheets

TEST SWITCH ASSEMBLY HAVING AN ELECTRONIC CIRCUIT

TECHNICAL FIELD

The present disclosure relates to a test switch assembly that is electrically coupled with an electronic module, to monitor, sense, detect, analyze, store, and/or transmit an electrical signal provided by an electrical power system, or an external current or voltage source.

BACKGROUND

Protective relays are commonly used in electric utility applications to detect various possible problems in an electrical power system. Such relays protect a wide variety of equipment and are used in power systems, which also include circuit breakers. The primary function of a relay is to provide trip signals to circuit breakers.

Generally, current transformers and potential transformers are employed to obtain a signal in high current and/or high potential applications. Transformers reduce the magnitude of the current or voltage, and then feed the signal to the relays, meters and instruments at a much lower level for detection. The relay terminals may then be electrically connected to test switch terminals or poles. Test switches can be associated with one or more relays.

As is known in the art, it is necessary to short circuit the line and load terminals when the relay is removed from its case or the adjacent test switch is opened. The test switch provides this necessary short circuit or bypass feature. If this short circuit does not occur, the associated current transformer may be damaged and the safety of nearby personnel could be jeopardized. Voltage measurements can also be made directly on test switches, without disturbing existing connections.

Recent advancement in sensor technology has made it possible to replace conventional current transformers ("CT's") and potential transformers ("PT's") with current and voltage sensors, which deliver even lower levels of voltage signals. Because of this, it does not require the short circuit or bypass feature.

Terminals of the relay are connected to the transformers/sensors through a test switch, which includes connectors or terminals. Each test switch assembly can be associated with one or more relays. Test switches are designed with a housing that supports individual switches, also known as "poles", and the rear terminals. The individual switches on the test switch assembly can be opened for the purposes of testing. In this manner, the test switch disconnects the protective relay from the sensors for the purposes of calibration and/or replacement. Thus, test switch assemblies are the means by which protective relays are taken out of service or isolated.

All measurements and tests can be performed at the front of the switchboard, without taking any devices out of service, and without the need to access wiring at the rear of the devices.

Test switches and test plugs have all the features necessary for applications involving the safe measurement and isolation of individual currents, voltages, and digital input/output ("I/O") signals to facilitate testing of substation instrumentation and protection devices.

Technicians require access to the front and/or rear panels of the test switches to perform maintenance as well as troubleshoot after fault events occurring in the system. However, safely accessing the test switch panel necessitates that the technician determines the energized status of the conductors in the switch and the multiple power sources before beginning work. What is needed therefor is a test switch assembly that provides additional features to determine the status of the switches and the current and voltage transformers, as well as to reduce the need for specialized test equipment used during maintenance and troubleshooting. Therefore, there is a significant need for the unique apparatuses, methods, systems and techniques disclosed herein.

SUMMARY

Exemplary embodiments include unique systems, methods, techniques and apparatuses for monitoring the operating condition of an industrial installation system having a plurality of pieces of equipment, devices, installations, and components. Further embodiments, forms, objects, features, advantages, aspects and benefits of the disclosure shall become apparent from the following description and drawings.

In one embodiment, there is provided an electronic test switch assembly for selectively opening and closing an electrical connection between a protective relay and either conventional CT's and PT's, current and voltage sensors or digital I/O's. The electronic test switch assembly includes a plurality of individual switches, each including a blade movable between an open and a closed position, wherein the blade in a closed position conducts one of the voltage or current output through the switch. The electronic test switch assembly also includes a plurality of signal interface connectors or terminals located at the rear, wherein the plurality of signal interface connectors is operatively connected to the plurality of the individual switches. A circuit board assembly is electrically connected to the plurality of signal interface connectors and to the plurality of individual switches, wherein the circuit board assembly includes a circuit configured to process current and the voltage signals.

In another embodiment, the circuit board or boards, contain intelligent electronics configured to sense, detect, identify, monitor and/or store current and voltage information. This information, in different embodiments, is then sent to remote displays, personal computers ("PC's"), or relays, through wires or wireless communication, or can change the status of onboard light emitting diodes ("LED's") or other illumination devices located in the test switch housing.

In still another embodiment, the signals processed as described herein, can be further utilized to detect fault, and provide alarm and/or for issuing trip commands to circuit breakers based on programmed settings.

DETAILED DESCRIPTION OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. In addition, while industrial systems include many different types and kinds of pieces of equipment, devices, components, and installation, these terms are used interchangeably herein unless otherwise noted. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

Figure 1:
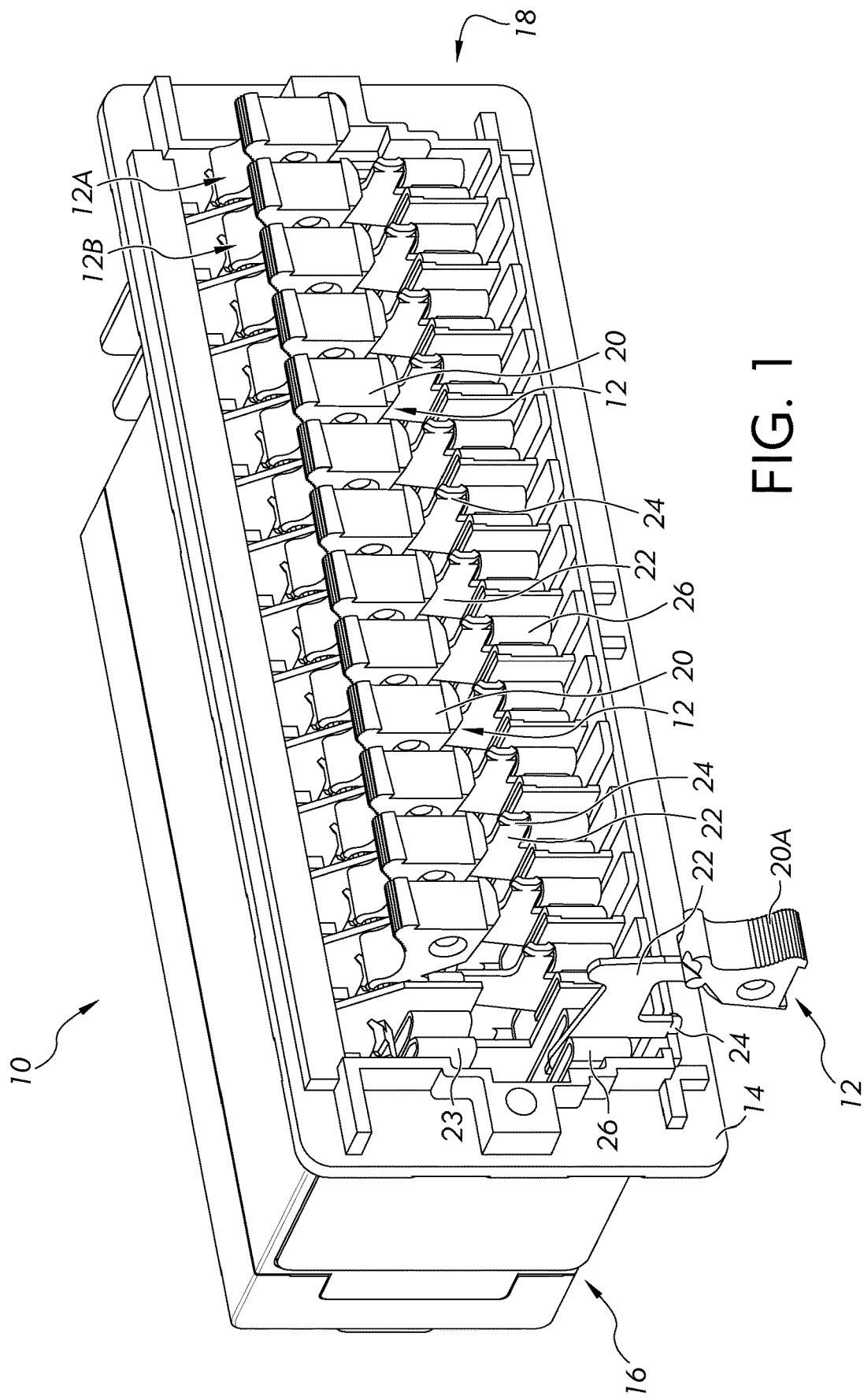
FIG. 1 is a front perspective view of an electronic test switch assembly including a plurality of individual switches.

FIG. 1 illustrates a front perspective view of an electronic test switch assembly 10 including a plurality of individual switches 12. The assembly 10 includes a front panel 14, configured to locate each of the plurality of individual switches 12 in a row extending from an end 16 to an end 18 of the assembly 10. The construction of the test switch 12 is understood by those skilled in the art and includes a handle 20 coupled to a shorting blade 22. In the illustrated position, each of the test switches 12 is in a closed position and the shorting blade 22 engages a top connector 23, or jaw. As the handle 20A is rotated downwardly, as illustrated, a shorting tab 24 moves to the illustrated location.

Figure 2:
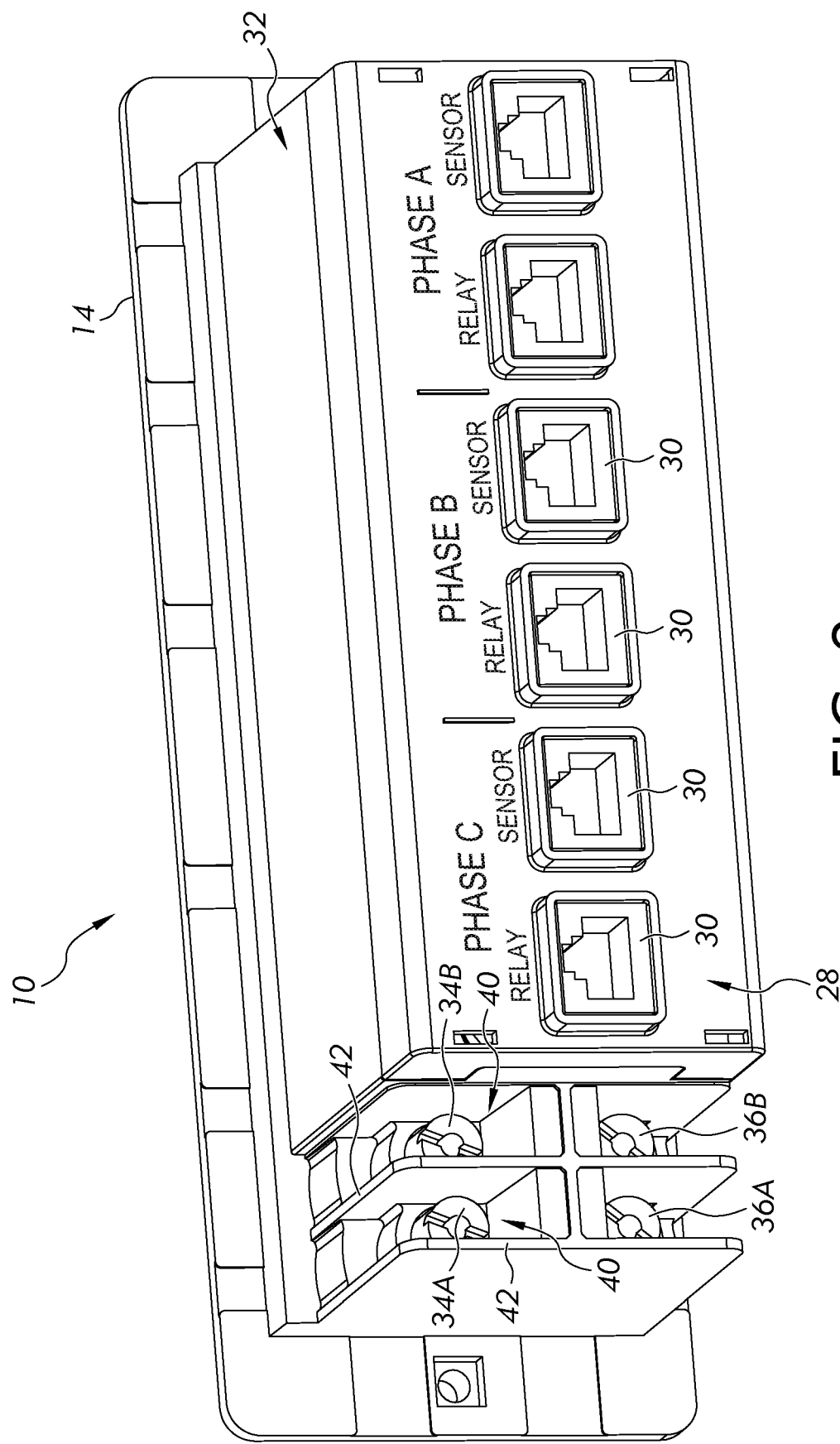
FIG. 2 is a rear perspective view of an electronic test switch assembly including plurality of modular connectors.

FIG. 2 is a rear perspective view of the electronic test switch assembly 10 including a rear cover 28, or rear panel, configured to support a plurality of interface connectors 30. Each one of the interface connectors 30 extends through an aperture 31 (see FIG. 3) defined in the rear cover 28. The rear cover 28 is operatively connected to an intermediate cover 32, which is operatively connected to the main housing 14. Each of the switches 12 is operatively connected to a top terminal 34 and a bottom terminal 36. The terminals 34 and 36 make electrical connections to the switch as understood by those skilled in the art. Terminals 34A and 36A are connected to test switch 12A of FIG. 1 and connectors 34B and 36B are connected to the test switch 12B of FIG. 1. Each of the terminals 34 and 36 is located in one of a plurality of recesses 40 defined by sidewalls 42. The sidewalls 42 provide a barrier between adjacent connectors 34 and 36. As further illustrated in FIG. 3, the main housing 14 includes a plurality of recesses 40 that are disposed along a rear side 44 and along the length of the main housing 14.

As seen in FIG. 2, each of the terminals 34 and 36 is a screw-type terminal to which an electrical lead can be connected. In this embodiment, the terminals 34 and 36 are a point of connection to the switch and only provide a direct connection to the switch. Each of the interface connectors 30, however, is operatively connected to a circuit board assembly 46 of FIG. 3 to which the interface connectors 30 are electrically coupled. The circuit board assembly 46 is located between the rear cover 28 and the intermediate cover 32.

Figure 3:
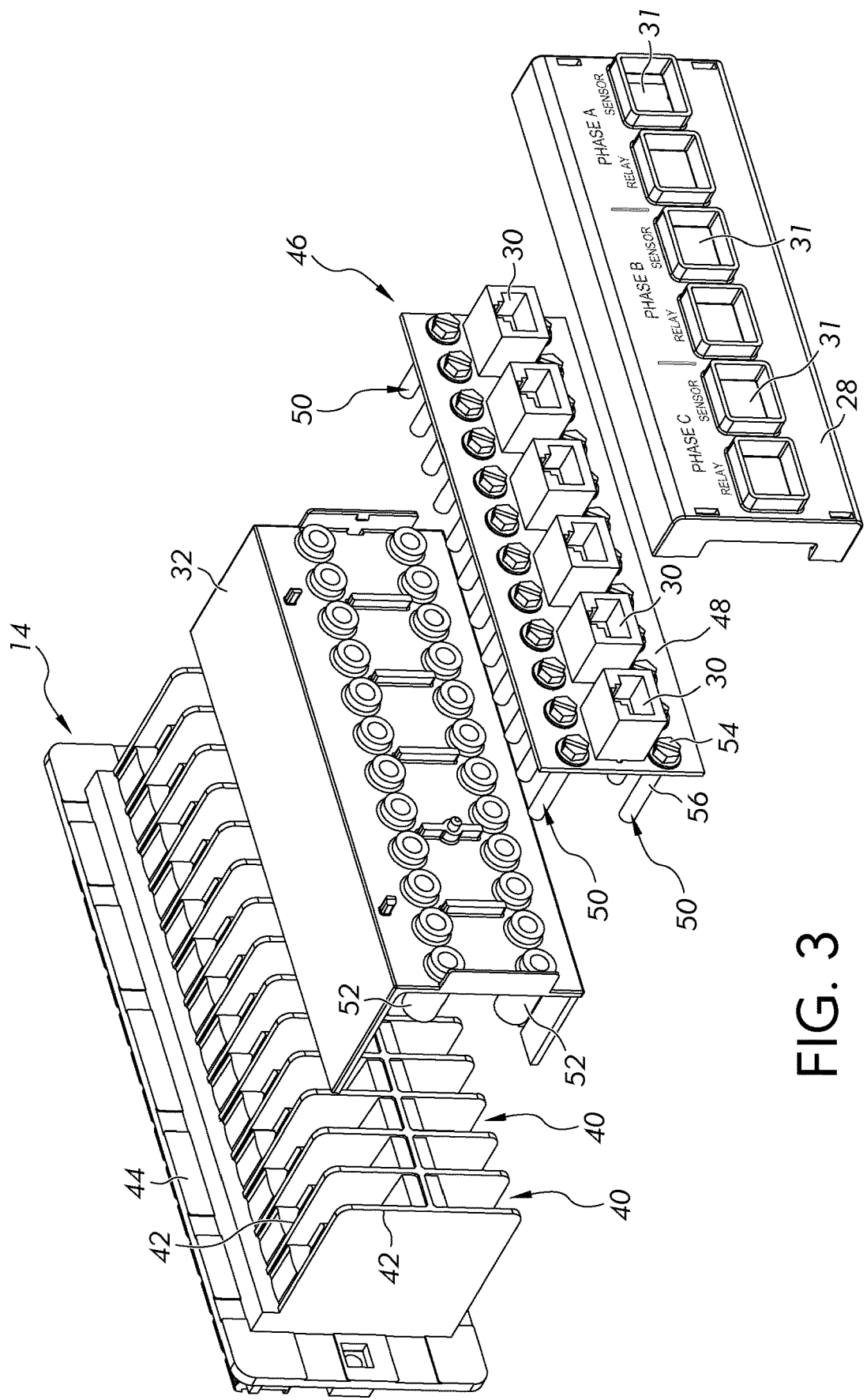
FIG. 3 is an exploded rear perspective view of an electronic test switch assembly including a plurality of modular connectors and a circuit board.

As can be seen in FIG. 2 and FIG. 3, the rear cover 28 and the intermediate cover 32 do not extend over every one of the plurality of recesses 40 along the entire length of the rear side 44. In the illustrated embodiment, the terminals 36A and 36B of switches 12A and 12B are exposed at the recesses 40. The remaining recesses are covered by the intermediate cover 32.

The circuit board assembly 46 includes a printed circuit board 48 that mechanically supports each of the interface connectors 30 as well as electrical and electronic components, which are coupled to conductive pad or tracks as understood by those skilled the art. The printed circuit board 48 board also includes a plurality of holes, each of which is configured to receive a signal interconnect 50 that extends through the printed circuit board 48 and into a plurality of channels 52 included as a part of the intermediate cover 32. Each of the signal interconnects 50 includes a terminating end 54 and a shaft 56. The shaft 56 extends through the channel 52 and is guided by the channel 52 toward the appropriate electrical connections of a respective switch. The electrical coupling made by the signal interconnects, in different embodiments, is made by a standard off-the-shelf screw or a custom-made screw that would enables a variety of electrical connections to be made (screw type, spade, banana jack, etc.). Depending on the particular application, the signal interconnects are made of a low impedance or a low resistance material, such as nickel, to provide adequate signal transmission.

Figure 4A:
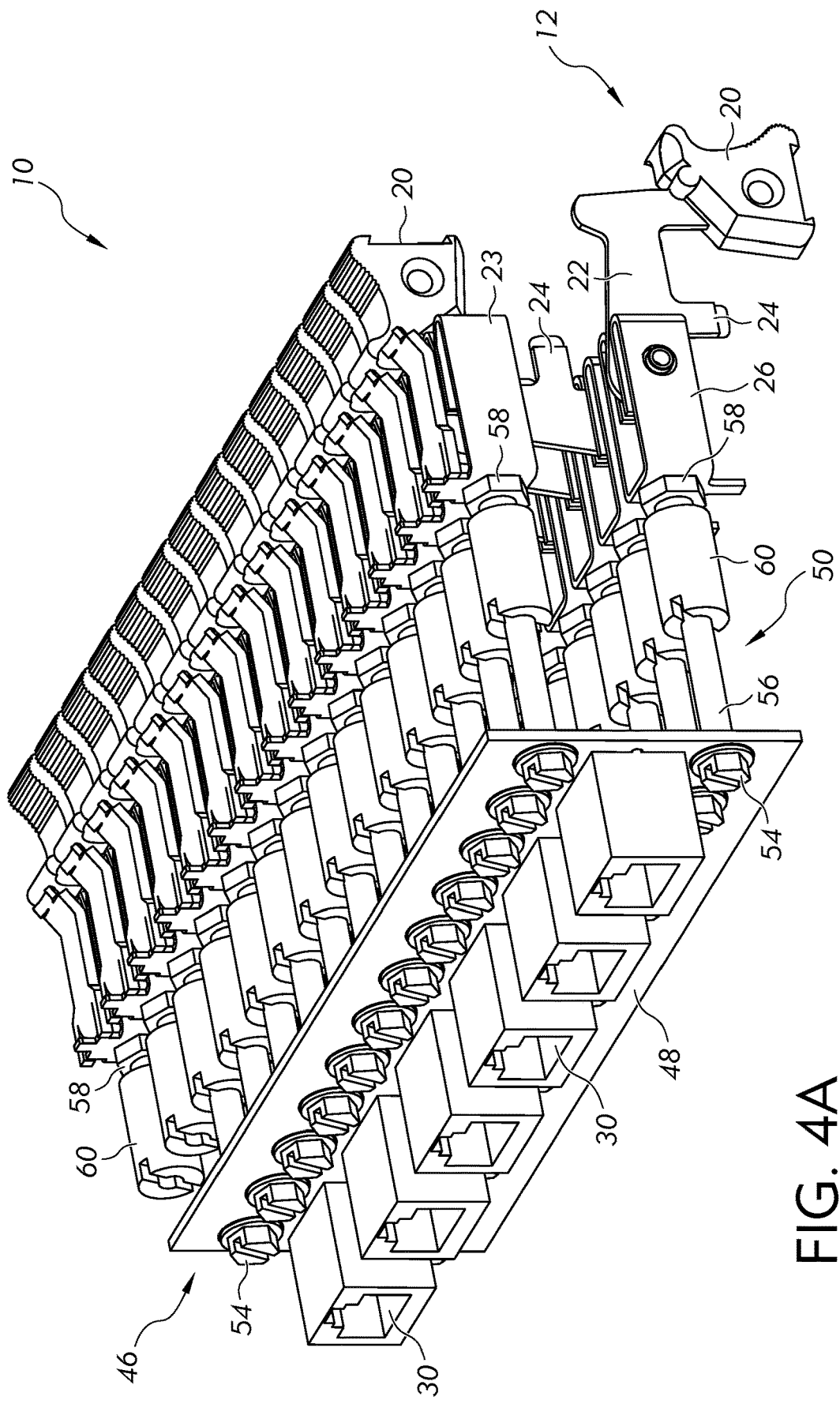
FIGS. 4A-4C are perspective and cross-sectional views of an electronic test switch assembly illustrating a circuit board located within the housing of the test switch assembly.
Figure 4B:
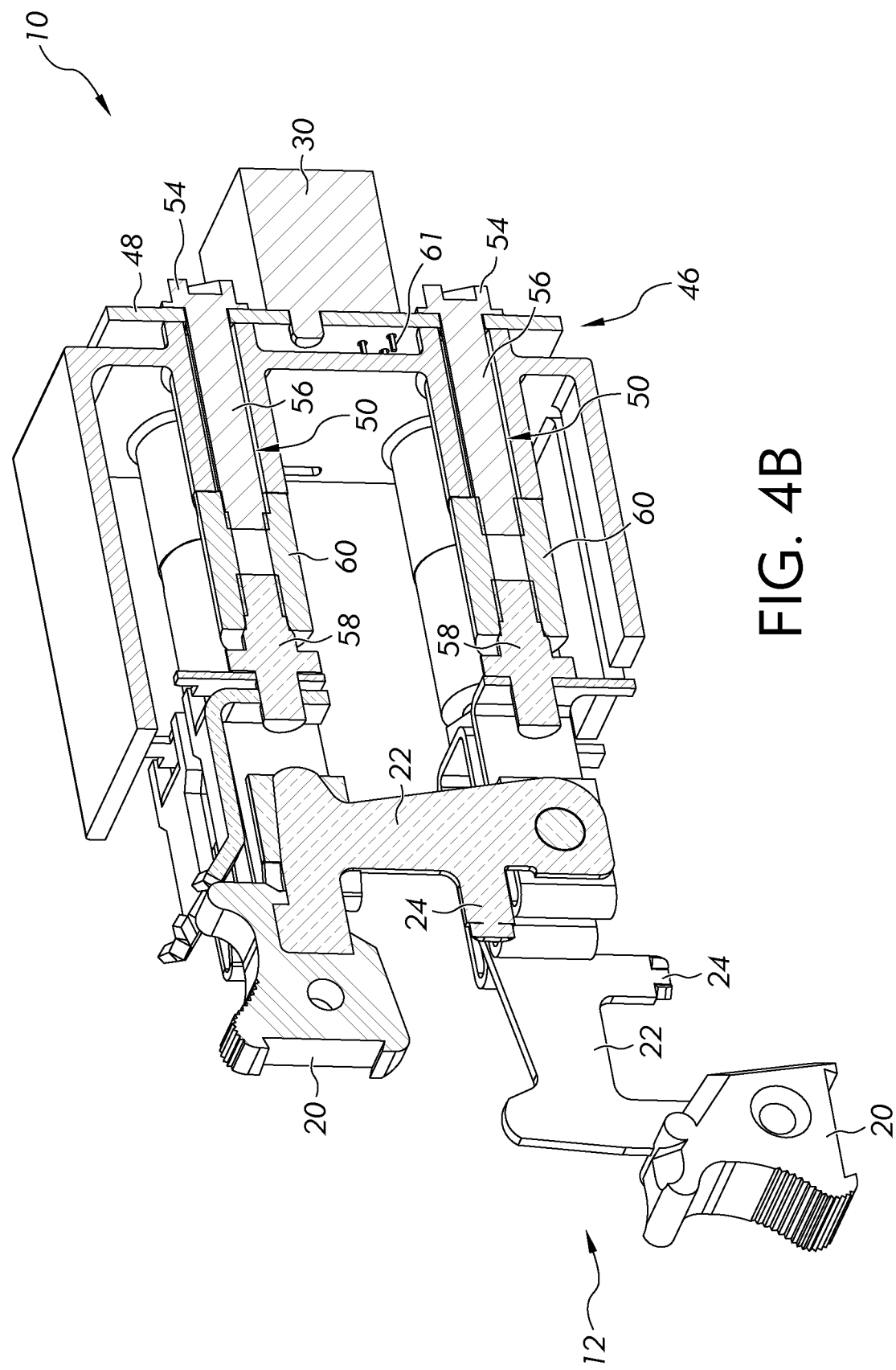
Figure 4C:
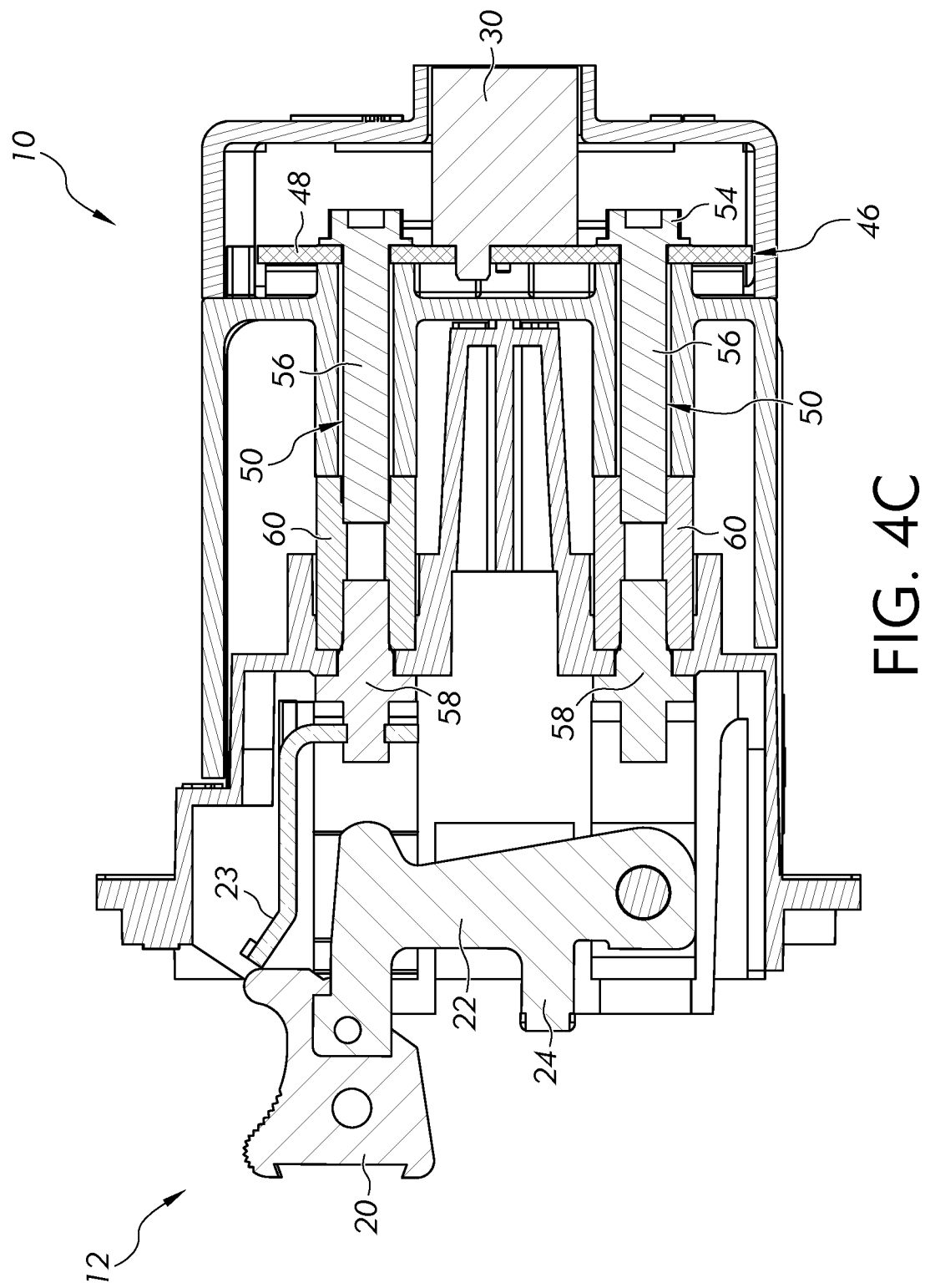

FIGS. 4A, 4B, and 4C is a different views of the test switch assembly 10 illustrating the circuit board assembly 46 located within the complete housing of the test switch assembly 10. In one embodiment as illustrated in a perspective view of FIG. 4A of the test switch assembly 10, the signal interconnect 50 is a screw having as the terminating end 54 a screw head, and as the shaft 56, a threaded portion configured to fixedly engage a threaded mount 60. The threaded mount 58 is fixedly coupled to the switch 12 and makes an electrical connection to the appropriate connectors 23 or 26. A sleeve 60 includes a channel through which the threaded mount 58 and the shaft 56 extend and in which the shaft 56 engages the threaded mount 60. Each of the signal interconnects 50, the threaded mount 58, and the sleeve 60, are electrically conductive. Consequently, any current passing through the switch 12 is conducted along the signal interconnect 50 to the printed circuit board 48, which includes an electrical contact connecting the shaft 56 to circuit components including the interface connector 30. In FIG. 4A, the intermediate cover 32 and front panel 14 are not shown for ease of illustration.

FIG. 4B illustrates a perspective cross-section of one of the switches 12 of FIG. 4A including the signal interconnects 50 and the interface connector 30. As can be seen in FIG. 4B, interface connector 30 includes terminals 61 which are configured to connect to the printed circuit board 48. Lastly FIG. 4C illustrated a plan sectional view of the configuration of FIG. 4B.

Figure 5:
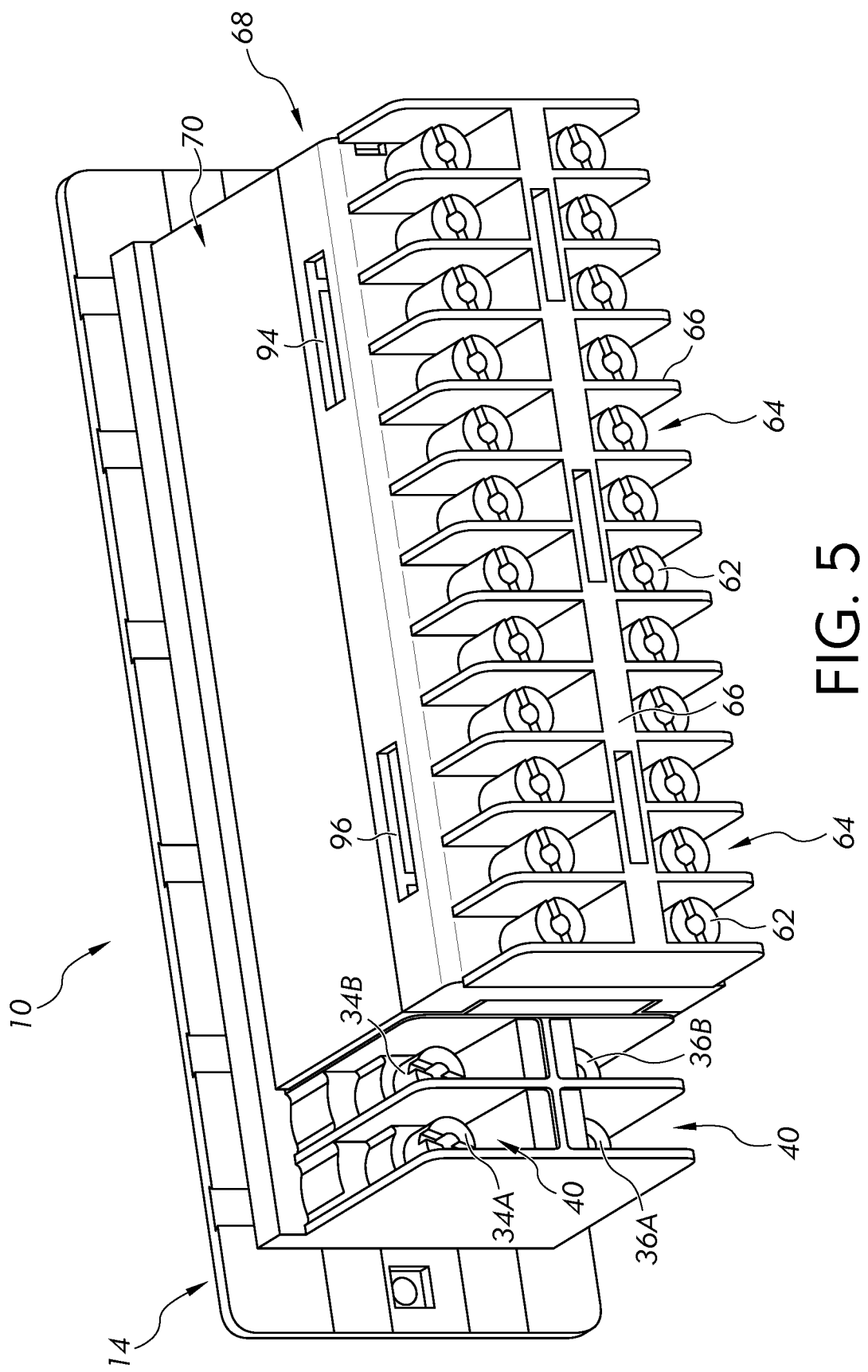
FIG. 5 is a rear perspective view of an electronic test switch assembly including plurality of rear connectors.

FIG. 5 is a rear perspective view of another embodiment of the test switch assembly 10 including a plurality of rear terminals 62. In this embodiment, each of the plurality of rear terminals 62 is located within a recess 64 defined by walls 66 of a rear housing 68. In this embodiment, the connectors are screw-type connectors configured to receive an electrical lead. The rear housing 68 is disposed adjacently to an intermediate cover 70, which is in turn disposed adjacently to the main housing 14, which includes the plurality of switches 12. The main housing 14 is configured similarly to the main housing 14 of FIGS. 1 and 3. The rear terminals 62 are individual wire connections, which are configured to connect to an electronic testing or analysis device having wired connections. In this embodiment, the rear terminals act as interface connectors to provide for signal transmission between the assembly ten and the electronic device.

Figure 6:
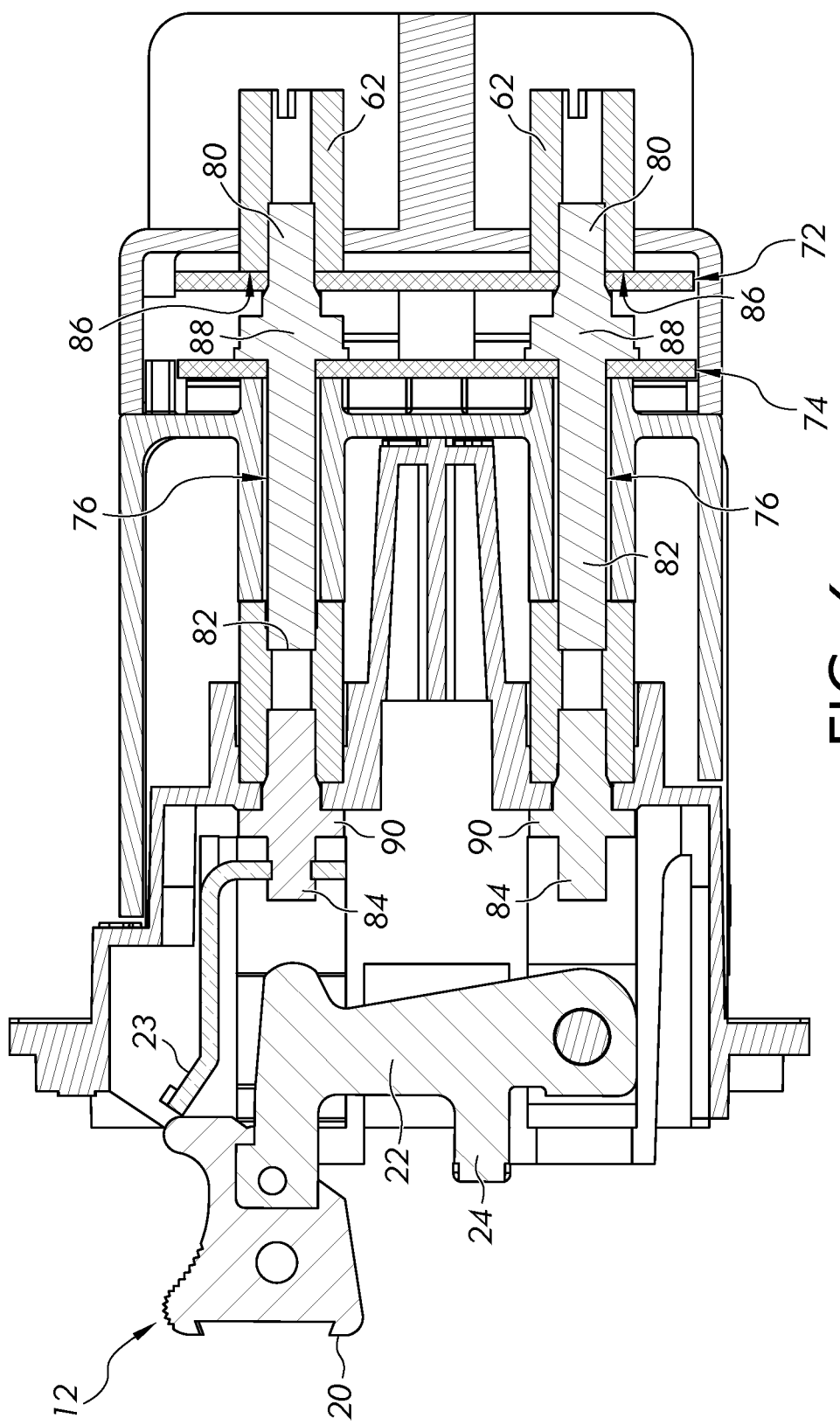
FIG. 6 is a cross-sectional view of an electronic test switch assembly illustrating a first circuit board and a second circuit board located within the housing of the test switch assembly.

The embodiment of FIG. 5, as further illustrated in FIG. 6, however, includes a first circuit board assembly 72 and a second circuit board assembly 74, each of which are electrically coupled to a plurality of signal interconnect 76. The signal interconnect 76 make an electrical connection between the rear terminals 62, circuits located on the first circuit board assembly 72, and circuits located on the second circuit board assembly 74. The signal interconnects 76 include an end 80 coupled to rear terminal 62 and a shaft 82 which extends from the end 80 to an end 84. The rear terminal 62 includes a conductive end 86 which contacts the circuit of the first circuit board 72 to make an electrical connection. The shaft 82 also includes a first shoulder 88, which conductively engages the circuit of the second circuit board assembly 74. A second shoulder 90 is defined by the shaft 82. By this configuration, an electrically conductive path is provided from the rear terminal 62, to each of the first and second circuit board assemblies 72 and 74, and to the switch 12.

Figure 7:
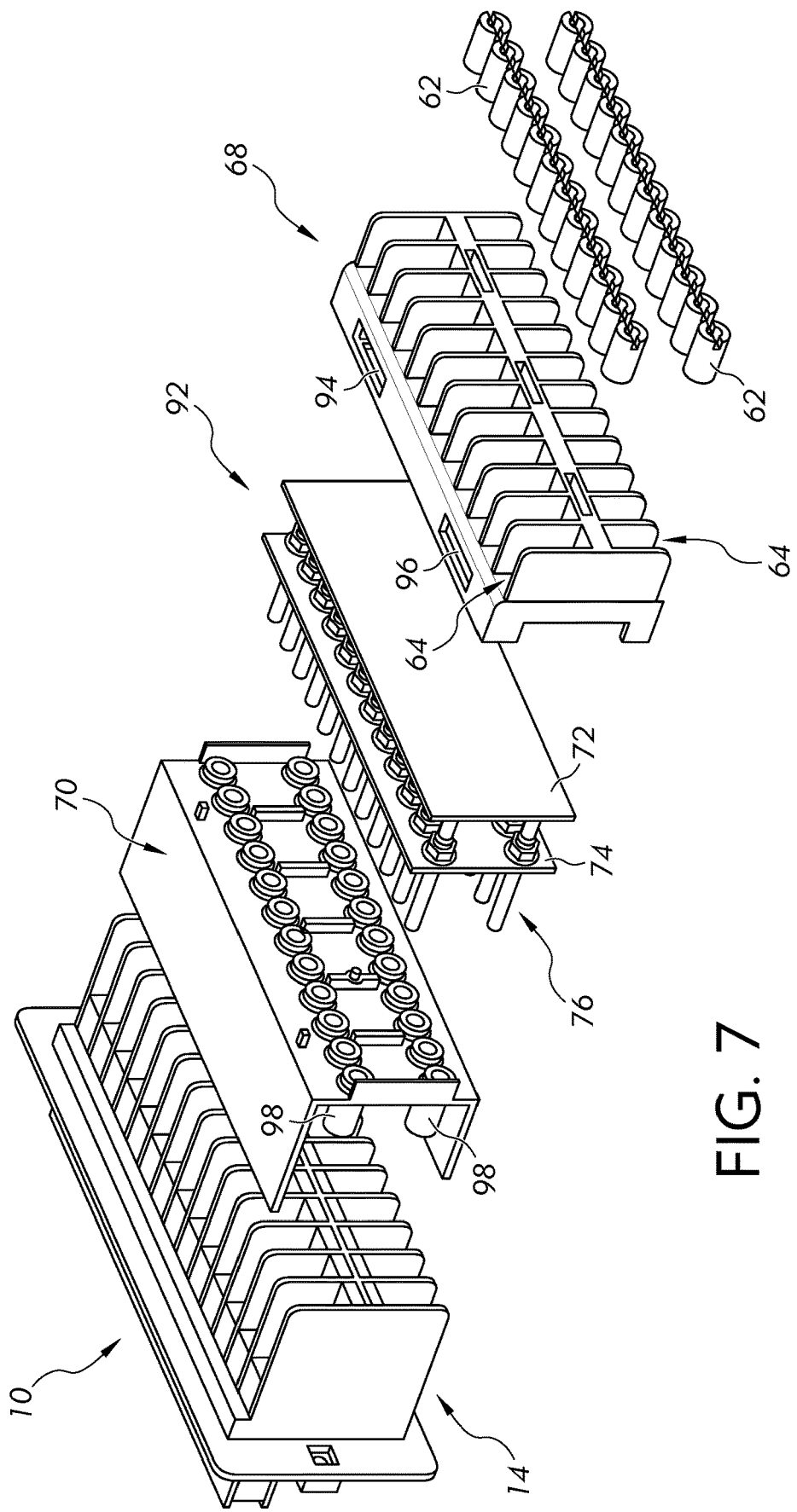
FIG. 7 is an exploded rear perspective view of an electronic test switch assembly including a plurality of modular connectors and a first circuit board and a second circuit board.

FIG. 7 illustrates an exploded rear perspective view of the test switch assembly 10 including the plurality of rear terminals 62. In this illustration, each of the plurality of rear terminals 62 are shown spaced from the recesses 64 defined by the rear housing 68. The rear housing 68 is disposed adjacently to an intermediate cover 70, which is in turn disposed adjacently to the main housing 14 and which includes the plurality of switches 12. A circuit board module 92 includes the first circuit board assembly 72 and the second circuit board assembly 74 which are coupled by the signal interconnect 76 as described above. The rear housing 68, when coupled to the main housing 14, covers each of the first and second circuit board assemblies 72 and 74, such that the circuitry located thereon is electrically accessible by the connectors as well as by an external connector received by a first port 94 and a second port 96. When the test switch assembly 10 is completed, each of the first and second ports 94 and 96 are appropriately located to enable electrical access to each of the first and the second circuit board assemblies 72 and 74.

In one embodiment, the first port 94 provides an electrical connection to the first circuit board assembly 72 and an appropriately configured first external connector. The second port 96, in this one embodiment, provides for an electrical connection to the second board assembly 74 for an appropriately configured second external connector. In different embodiments, the first and second ports include a high definition multimedia interface (HDMI) port and a universal serial bus (USB) port. The first and second ports 94 and 96 are not, however, limited to these types of connectors and other connectors are possible.

As seen in FIG. 7, the intermediate cover 70 is similarly configured as the intermediate cover 32 of FIG. 3. Each of the signal interconnects 76 extend through the channels 98 and is guided by the channels 98 toward the appropriate electrical connections of a respective switch. The main housing 14 is configured as previously described.

Figure 8:
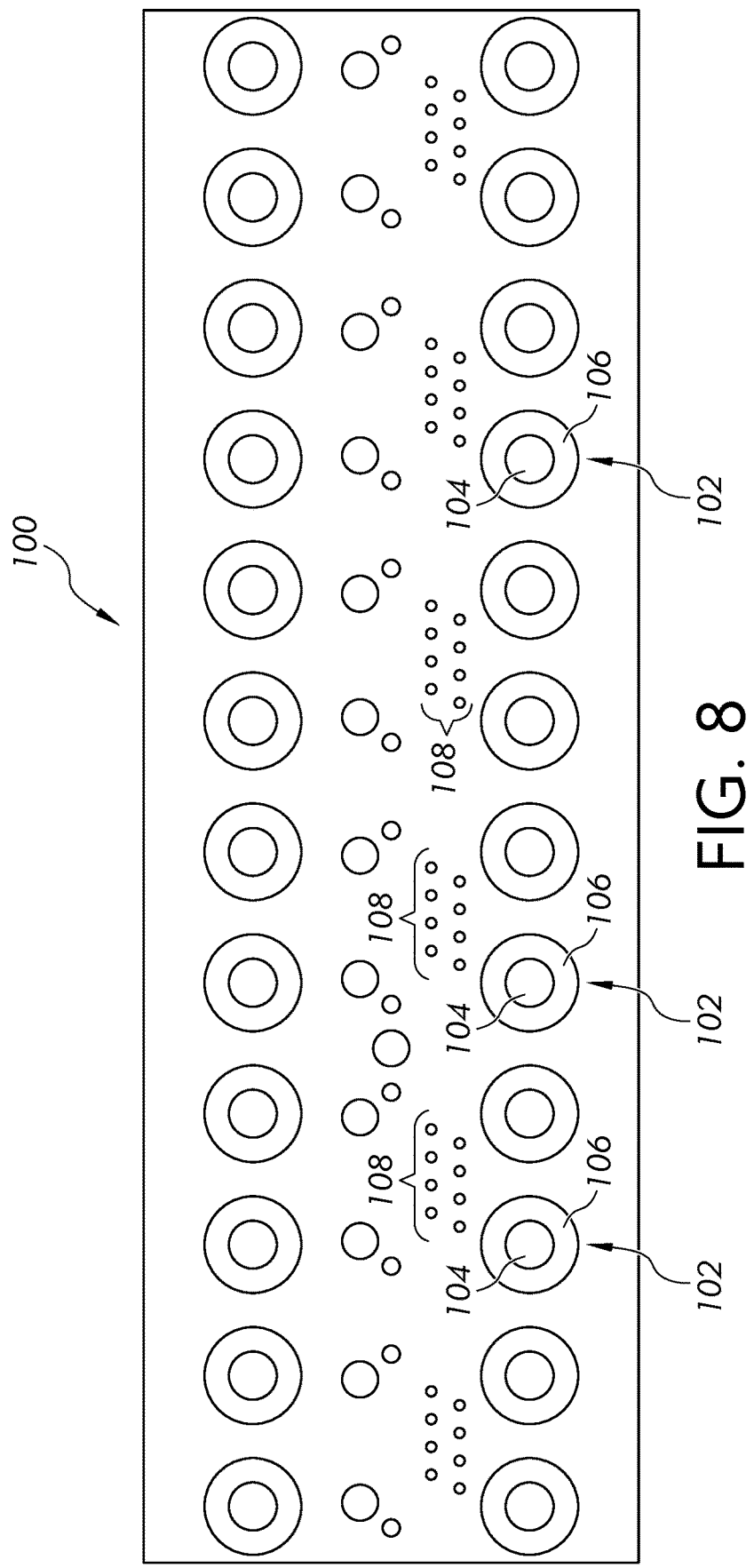
FIG. 8 is an elevational view of a printed circuit board.

FIG. 8 is an elevational view of one embodiment of a printed circuit board 100 as configured for one or both of the circuit board assembly 46, the first circuit board assembly 72, and the second circuit board assembly 74. The printed circuit board 100 includes a plurality of etched connectors 102, each of which includes a generally circular aperture 104 having a size configured to receive a shaft of the signal interconnects. A conductive contact ring 106 surrounds the circular aperture 104 and is configured to interface with the terminating end 54 of the shaft 56 or one of the shoulders 88 and 90 of the signal interconnect 76. Additional apertures 108 are located on the printed circuit board 100 to accept leads of the various devices, components, circuits, integrated circuit chips, and connectors, which are arranged in the circuit located on the printed circuit board. Etched circuit paths to connect the leads are not shown, but are included as understood by those skilled in the art.

The circuit board assemblies provide additional capabilities not currently found in known purely mechanical test switches that merely transmit or mechanically interrupt an electrical circuit connection. In one embodiment, the circuit board assembly electrically routes connections through the switch blades to an RJ45 connectors to facilitate electrical connections to sensors, relays, and test equipment. In another embodiment, the circuit board assembly includes "intelligent electronics" that sense, detect, monitor, analyze and store electrical signals and output the characteristics of the electrical signals to standalone displays, computers, or similar terminals. "Intelligent electronics" include electronic circuits and/or devices that process data to make a decision. When the circuit board assembly is configured with "intelligent electronics", sophisticated electronic circuitry and software is provided to enable the test assembly to detect currents and voltages, record fault conditions, and detect open circuits.

The present disclosure provides an electronic test switch assembly that is simple to install, provides a low cost solution, and is retrofittable. The configuration of the circuit board including advanced circuitry is customizable as a function of the devices located on the circuit board assembly through the use of modular circuit components or programmable functions using processors and software.

In one embodiment utilizing "intelligent electronics", various applications that require local and/or remote monitoring, and/or aid in problem solving a system setup, and/or aid in the commissioning of a new protective relay system are provided.

Figure 9:
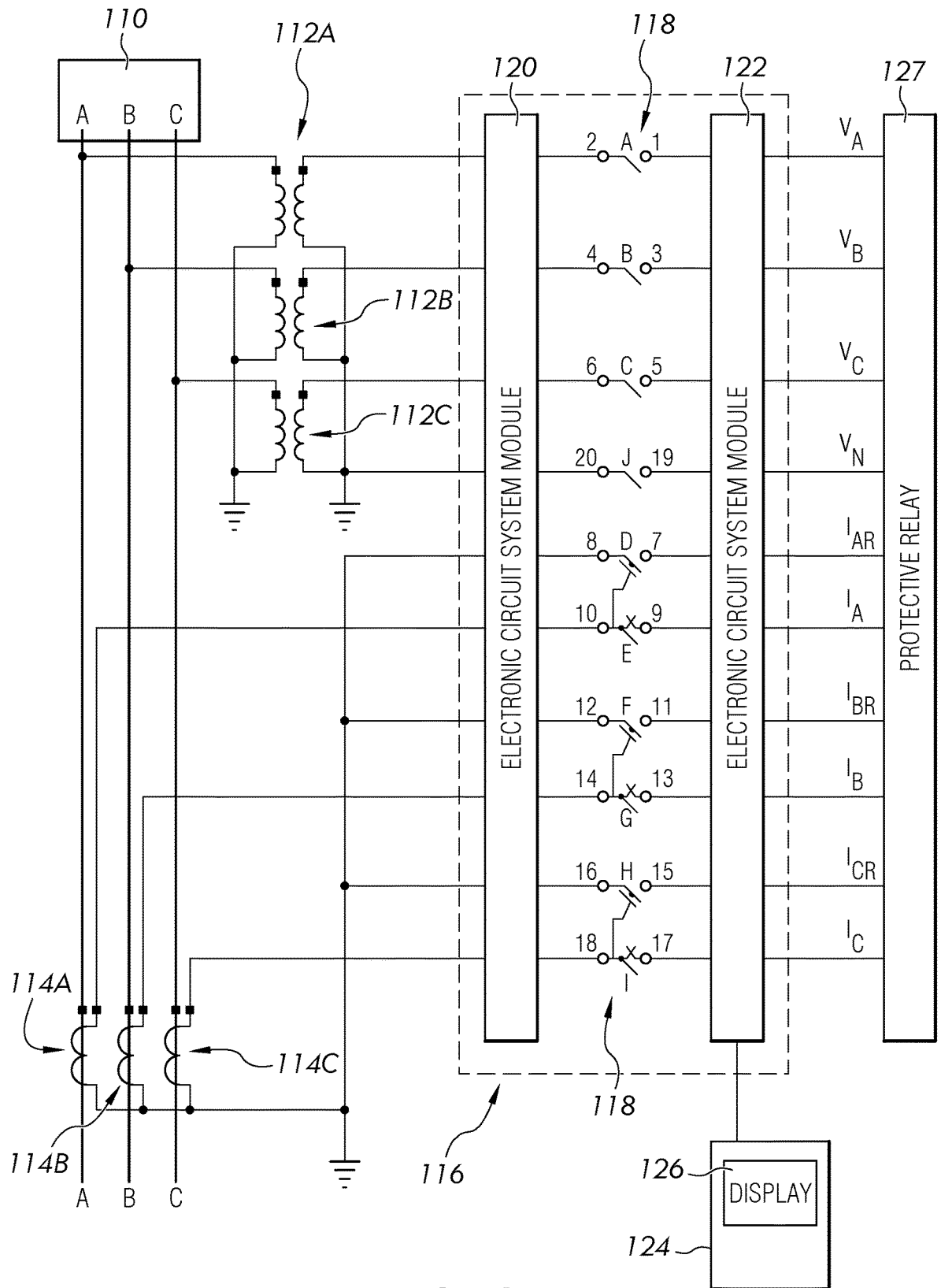
FIG. 9 is a schematic diagram of one embodiment of a test switch assembly coupled to a source of power.

FIG. 9 is a schematic diagram of one embodiment of an electronic test switch assembly coupled to a power source 110. The power source 110, in this embodiment, is a polyphase electric power source generating alternating current as three phases, here identified as A, B, and C. Each phase is carried by a current carrying conductor and the characteristic of each phase is determined or identified by a potential transformer 112. The current carried by each conductor is determined by a current transformer 114. The output of each of the transformers 112 and 114 is provided to an electronic test switch assembly 116 including a plurality of individual switches 118 as previously described. An electronic circuit system module 120 and an electronic circuit module 122 are illustrated and are included in the housing of the test switch assembly 116. In one embodiment the electronic circuit modules 120 and 122 are configured as a single circuit board assembly as shown in FIG. 3. In another embodiment, the electronic circuit modules 120 and 122 are configured as a two separate circuit board assemblies as shown in FIG. 7. In other embodiments, the number of circuit boards is not limited to one or to two.

The electronic circuit board modules include, in different embodiments, simple point-to-point connections between poles of the switches 118 to various connectors including, but not limited to, an RJ45 (registered jack) connector, an USB (universal serial bus) connector, and RS232 (standard or non-standard) connector, a BNC (Bayonet Neill-Concelman) connector, a banana jack connector, and an RCA jack connector. In other embodiments, the circuitry located on the printed circuit boards includes additional features including circuitry to detect, sense, monitor, analyze, and/or redistribute, electrical currents and voltages that could be continuous or transient. In addition, circuitry to collect, store, analyze, or identify the sensed values provides the values as information to, for instance, a remote display, a storage device, status LED's mounted on the circuit board, or a computer, through wired and/or wireless methods. The circuitry includes, but is not limited to, discrete devices, integrated devices, integrated circuitry, control circuitry, including a processor such as a microprocessor, and memory. The sophisticated electronics can be designed for any numbers of poles. While the disclosed embodiments use 10 or 12 poles, other designs include 2 to 14 poles or more poles, or combinations thereof.

In one embodiment for instance, the module 122 provides the sensed and identified values to an electronic device 124, having a display 126. The connection to the electronic device 124 is one of a wireless and wired connection. In one embodiment, the electronic device is a mobile electronic device including, but not limited to, a mobile phone, a laptop computer, and a tablet computer. The display 126, in different embodiments, is configured to display the sensed voltage or current or the states of each of the switches 118 as being an open state or a closed state. In different embodiments, the device is one or more of a data collector or concentrator, a remote terminal unit (RTU), a personal computer, or similar devices, the device 124 is one or more LEDs having illuminated and non-illuminated states configured to provide status information. In still other embodiments, the data collector collects data from various potential transformers, current transformers and sensors. Other embodiments include audible indicators configured to indicate that an unwanted condition has occurred. In these and other embodiment, the device 124 include visual indicators, audible indicators, and a combination of both visual indicators and audible indicators.

In FIG. 9, a plurality of relays 127 are coupled to outputs of the test switch assembly. The relays are protective relays and include in one or more embodiments, electromechanical relays, solid state relays, microprocessor based relays, or digital relays. In the event an electromechanical relay is used, the switches D through I are shorting switches, which provides a protective function when the switches are positioned in one state or another state, as understood by those skilled in the art. In another embodiment, the electronic device 124 is a visual indicator, such as light emitting diode, physically coupled to the test switch assembly, displaying a light in one of two states. For instance, the color of the light indicates of the open state or closed state of the switch.

Figure 10:
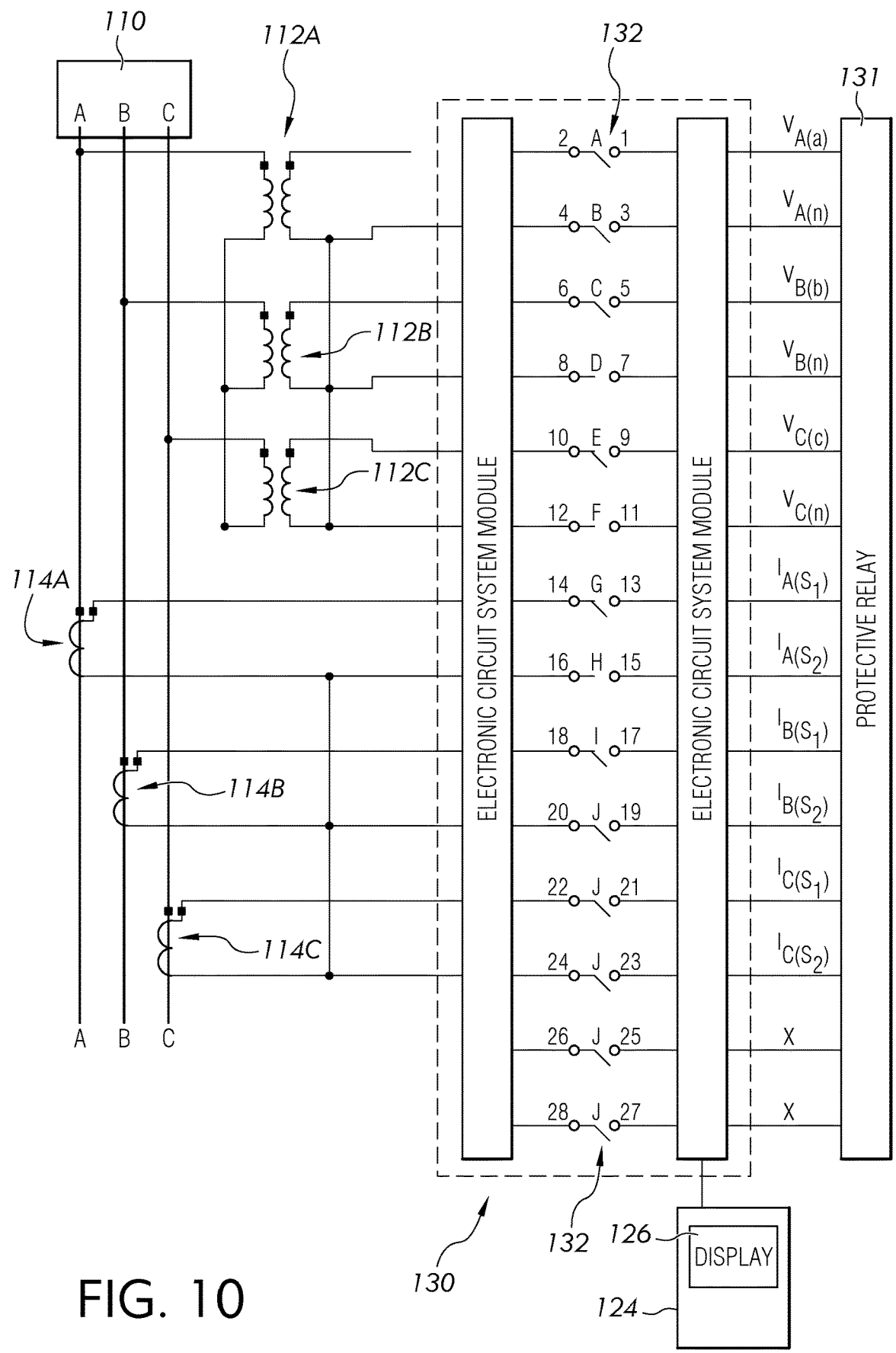
FIG. 10 is a schematic diagram of another embodiment of a test switch assembly coupled to a source of power.

FIG. 10 is a schematic diagram of another embodiment of a test switch assembly coupled to a source of power 110. In this embodiment, the power source 110 provides alternating current as three phases, sensed by the potential sensor 112 and the current sensed by a current sensor 114. In this embodiment, however, a test switch assembly 130 is coupled to a sensor based relay 131. To accommodate the different types of relays, when compared to the relays of FIG. 9, the test switch assembly 130 includes a plurality of switches 132, each of which is a simple mechanical switch having an open state and a closed state, but not a shorting state. In this embodiment, shorting switches are not required, since the sensor based relays do not require a short to ground when the switch changes states since the relay 131 require less current. In one embodiment, the sensors are known as integral capacitive voltage sensors to allow for voltage measurement. These types of sensors have a Low Energy Analog (LEA) output, which provides a LEA input to the interface connectors. Such signals are much weaker than those provided by the potential or current transformers of FIG. 9. In other embodiments, other types of sensors having an LEA output signal are contemplated. In different embodiments, the type of interface connector is selected depending on the type of sensor. For instance, in one embodiment when using an LEA output type of sensor, an RJ45 interface connector is used.

While the present disclosure has been illustrated and described in detail in the drawings and foregoing description, the same is to be considered as illustrative and not restrictive in character, it being understood that only certain exemplary embodiments have been shown and described and that all changes and modifications that come within the spirit of the present disclosure are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with or a connection to another item as well as a belonging to or a connection with the other item as informed by the context in which it is used. The terms "coupled to", "coupled with" and the like include indirect connection and coupling and further include but do not require a direct coupling or connection unless expressly indicated to the contrary. When the language "at least a portion" and/or "a portion" is used the item can include a portion and/or the entire item unless specifically stated to the contrary.

What is claimed is:

1. An electronic test switch assembly for selectively opening and closing an electrical connection between a protective relay and a transformer or sensor providing one of a voltage or a current comprising:
   a plurality of individual switches, each including a blade movable between an open and a closed position, wherein the blade in a closed position conducts one of the voltage and current through the switch;
   a plurality of signal interconnects, wherein the signal interconnects are electrically connected to the individual switches and to a plurality of outputs of the electronic test switch; and
   a circuit board assembly electrically connected to the signal interconnects and to the individual switches, wherein the circuit board assembly includes a circuit configured to process the current or the voltage.

2. An electronic test switch assembly for selectively opening and closing an electrical connection between a protective relay and a transformer or sensor providing one of a voltage or a current comprising:
- a plurality of individual switches, each including a blade movable between an open and a closed position, wherein the blade in a closed position conducts one of the voltage and current through the switch;
- a plurality of signal interconnects, wherein the signal interconnects are operatively connected to the individual switches; and
- a circuit board assembly electrically connected to the signal interconnects and to the individual switches, wherein the circuit board assembly includes a circuit configured to process the current or the voltage,
- further comprising a plurality of interface connectors, wherein the circuit board assembly is physically disposed between the individual switches and the plurality of interface connectors.

3. The electronic test switch assembly of claim 2 wherein the plurality of signal interconnects are configured to provide an electrical connection between the circuit board and the interface connectors.

4. The electronic test switch assembly of claim 2 wherein the plurality of signal interconnects are configured to provide an electrical connection between the circuit board, the plurality of switches, and the plurality of interface connectors.

5. The electronic test switch assembly of claim 2 wherein the electronic test switch assembly includes a main housing and a rear cover, wherein the plurality of switches are accessible at the main housing and the plurality of interface connectors are accessible at the rear cover.

6. The electronic test switch assembly of claim 5 wherein the signal interconnects is configured to provide an electrical connection between the circuit board and the individual switches.

7. The electronic test switch assembly of claim 6 wherein the circuit board assembly is physically disposed between the main housing and the rear cover.

8. The electronic test switch assembly of claim 7 wherein the signal interconnects are configured to extend from the circuit board to the individual switches and to provide a physical support between the circuit board and the plurality of individual switches.

9. The electronic test switch assembly of claim 8 wherein the plurality of interface connectors comprises one of an RJ45 connector, an USB connector, and RS232 connector, a BNC connector, a banana jack connector, and an RCA jack connector.

10. The electronic test switch assembly of claim 9 wherein the circuit includes an input and an output, wherein the input is coupled to the switch and the output is coupled to the interface connectors.

11. An electronic test switch assembly for selectively opening and closing an electrical connection between a protective relay and a transformer or sensor providing one of a voltage or a current comprising:
- a main housing including individual switches each having an open position and a closed position, wherein the individual switches in the closed position conduct one of the voltage and the current through the individual switch;
- a rear panel including interface connectors operatively connected to the individual switches;
- a circuit board assembly electrically connected to the interface connectors and to the individual switches, wherein the circuit board assembly includes a circuit configured to process one of the current and the voltage; and
- a plurality of signal interconnects that each provide an electrical connection between the circuit board assembly, a corresponding switch of the individual switches, and a corresponding output of a plurality of outputs of the electronic test switch.

12. The electronic test switch assembly of claim 11, wherein the plurality of outputs comprises either a plurality of interface connectors or a plurality of rear terminals.

13. An electronic test switch assembly for selectively opening and closing an electrical connection between a protective relay and a transformer or sensor providing one of a voltage or a current comprising:
- a main housing including individual switches each having an open position and a closed position, wherein the individual switches in the closed position conduct one of the voltage and the current through the individual switch;
- a rear panel including interface connectors operatively connected to the individual switches;
- a circuit board assembly electrically connected to the interface connectors and to the individual switches, wherein the circuit board assembly includes a circuit configured to process one of the current and the voltage; and
- a plurality of signal interconnects, each of which is configured to provide an electrical connection between the circuit board, the individual switches, and the interface connectors,
- wherein the circuit board assembly is disposed between the main housing and the rear panel.

14. The electronic test switch assembly of claim 13 wherein each of the signal interconnects extends from the circuit board assembly to the main housing and provides a physical support between the circuit board assembly and the main housing.

15. The electronic test switch assembly of claim 14 wherein the circuit board includes a plurality of apertures through which the signal interconnects extend.

16. The electronic test switch assembly of claim 14 wherein each of the signal interconnects includes a shaft, wherein one end of the shaft makes an electrical connection with the circuit board and the other end of the shaft makes an electrical connection with one of the individual switches.

17. The electronic test switch assembly of claim 16 wherein each of the interface connectors is fixedly connected to the circuit board.

18. A method of testing an electrical characteristic of a multiphase electrical system configured to transmit a primary current and voltage signals to a receiving circuit comprising:
- receiving the primary current or voltage signals;
- identifying the received primary signals as one of a sensed current and a sensed voltage;
- transmitting the identified one of the sensed current and the sensed voltage through a switch of an electronic test switch assembly;
- transmitting, from the switch, the identified one of the sensed current and the sensed voltage through a circuit board and to an output of the electronic test switch assembly, the circuit board having a circuit coupled to the switch; and
- processing the received sensed current and the sensed voltage with the circuit to provide a characteristic thereof.

19. The method of claim 18 wherein the transmitting step includes transmitting the one of the sensed current and the sensed voltage through the circuit located in a housing of a switch assembly.

20. The method of claim 19 further comprising displaying the characteristic of the processed one of the sensed current and the sensed voltage.

21. The method of claim 19 further comprising transmitting the characteristic of the processed one of the sensed current and sensed voltage to other devices through wired or wireless communication.

22. The method of claim 18 wherein the characteristic of the processed sensed current and sensed voltage are further utilized to detect a fault and to provide an alarm and/or trip command to a circuit breaker based on programmed settings.

* * * * *